United States Patent
Takabayashi et al.

(10) Patent No.: US 9,722,397 B2
(45) Date of Patent: Aug. 1, 2017

(54) TUNABLE LASER AND TUNABLE LASER MODULE

(71) Applicant: FUJITSU LIMITED, Kawasaki-shi, Kanagawa (JP)

(72) Inventors: Kazumasa Takabayashi, Atsugi (JP); Tsuyoshi Yamamoto, Zama (JP); Manabu Matsuda, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/942,026

(22) Filed: Nov. 16, 2015

(65) Prior Publication Data

US 2016/0156149 A1 Jun. 2, 2016

(30) Foreign Application Priority Data

Nov. 28, 2014 (JP) ................................. 2014-241640

(51) Int. Cl.
| | |
|---|---|
| *H01S 5/14* | (2006.01) |
| *H01S 3/106* | (2006.01) |
| *H01S 5/02* | (2006.01) |
| *H01S 5/026* | (2006.01) |
| *H01S 5/06* | (2006.01) |
| *H01S 5/0687* | (2006.01) |
| *H01S 5/12* | (2006.01) |

(Continued)

(52) U.S. Cl.
CPC .............. *H01S 5/142* (2013.01); *H01S 3/106* (2013.01); *H01S 5/021* (2013.01); *H01S 5/0265* (2013.01); *H01S 5/0612* (2013.01); *H01S 5/0687* (2013.01); *H01S 5/125* (2013.01); *H01S 5/1215* (2013.01); *H01S 5/227* (2013.01); *H01S 5/34306* (2013.01)

(58) Field of Classification Search
CPC .... H01S 3/06791; H01S 3/1305; H01S 3/025; H01S 3/083; H01S 3/1003; H01S 3/0675
See application file for complete search history.

(56) References Cited

U.S. PATENT DOCUMENTS

| | | | |
|---|---|---|---|
| 7,962,045 B2 * | 6/2011 | McCallion | ......... G02B 6/12007 398/185 |
| 2005/0030986 A1 | 2/2005 | Farrell | |

(Continued)

FOREIGN PATENT DOCUMENTS

| | | |
|---|---|---|
| JP | 2010-27664 A1 | 2/2010 |
| JP | 2011-222983 A1 | 11/2011 |

(Continued)

*Primary Examiner* — Xinning Niu
(74) *Attorney, Agent, or Firm* — Kratz, Quintos & Hanson, LLP

(57) ABSTRACT

A tunable laser includes: a wavelength filter that includes a first ring resonator and a second ring resonator each of which is formed by a waveguide including a silicon waveguide core, and each of which is capable of shifting each of resonance wavelengths that exit periodically and whose intervals are different from each other; and an integrated device that is optically coupled to the wavelength filter, and in which a first semiconductor optical amplifier and a reflector are provided in sequence from a side of the wavelength filter, wherein the resonance wavelengths of the first ring resonator and the second ring resonator are overlapped with each other at one wavelength, and the resonance wavelengths are overlapped with each other also at a plurality of wavelengths other than the one wavelength.

3 Claims, 14 Drawing Sheets

(51) Int. Cl.
H01S 5/125 (2006.01)
H01S 5/227 (2006.01)
H01S 5/343 (2006.01)

(56) References Cited

U.S. PATENT DOCUMENTS

| | | | |
|---|---|---|---|
| 2006/0078010 A1* | 4/2006 | Kim | H01S 3/067 372/18 |
| 2006/0198415 A1* | 9/2006 | Yamazaki | G02B 6/12007 372/94 |
| 2006/0198416 A1* | 9/2006 | Yamazaki | H01S 5/0612 372/94 |
| 2009/0046748 A1* | 2/2009 | Kato | H01S 5/026 372/20 |
| 2009/0122817 A1 | 5/2009 | Sato | |
| 2011/0235667 A1 | 9/2011 | Fukuda | |

FOREIGN PATENT DOCUMENTS

| | | |
|---|---|---|
| JP | 2012-33807 A1 | 2/2012 |
| WO | WO 03023916 A1 | 3/2003 |
| WO | WO 2007029647 A1 | 3/2007 |
| WO | WO 2014115330 A1 | 7/2014 |

* cited by examiner

TUNABLE LASER AND TUNABLE LASER MODULE

CROSS-REFERENCE TO RELATED APPLICATION

This application is based upon and claims the benefit of priority of the prior Japanese Patent Application No. 2014-241640, filed on Nov. 28, 2014, the entire contents of which are incorporated herein by reference.

FIELD

The embodiments discussed herein are related to a tunable laser and a tunable laser module.

BACKGROUND

As a tunable laser capable of changing wavelengths in a wide wavelength range, there is a laser obtained by combining a semiconductor optical amplifier (SOA) and a vernier-type filter capable of selecting any wavelength using a combination of two filters each having a periodical wavelength selection characteristic. The tunable laser using the vernier-type filter includes, for example, a laser using two ring resonators and a laser using two sampled grating distributed Bragg reflectors (SG-DBRs) as filters.

In a tunable laser using an SOA and a wavelength filter including two ring resonators each of which is formed by a waveguide including a silicon waveguide core, when current applied to the SOA is increased and a laser output is increased, the operation becomes unstable. This is caused by the following reasons. When the laser output is increased, high intensity light is propagated to the silicon waveguide including the silicon waveguide core inside the laser resonator, and two-photon absorption occurs, so that photo careers are collected in the silicon waveguide, thereby changing an equivalent refractive index of the silicon waveguide. In addition, the change in the equivalent refractive index of the silicon waveguide causes fluctuation of the resonance wavelength of the ring resonator, which is determined based on the product of the equivalent refractive index and a circumference of the ring resonator. As a result, the oscillation wavelength of the laser is fluctuated, and the oscillation spectrum is widened, and multi-mode oscillation occurs, so that the operation becomes unstable.

Therefore, in the tunable laser using the SOA and the wavelength filter including two ring resonators each of which is formed by the waveguide including the silicon waveguide core, it is difficult to achieve the high output.

The followings are reference documents.
[Document 1] International Publication Pamphlet No. WO2003/023916 and
[Document 2] International Publication Pamphlet No. WO2007/029647.

SUMMARY

According to an aspect of the invention, a tunable laser includes: a wavelength filter that includes a first ring resonator and a second ring resonator each of which is formed by a waveguide including a silicon waveguide core, and each of which is capable of shifting each of resonance wavelengths that exit periodically and whose intervals are different from each other; and an integrated device that is optically coupled to the wavelength filter, and in which a first semiconductor optical amplifier and a reflector are provided in sequence from a side of the wavelength filter, wherein the resonance wavelengths of the first ring resonator and the second ring resonator, each of which exists periodically, are overlapped with each other at one wavelength, and the resonance wavelengths are overlapped with each other also at a plurality of wavelengths other than the one wavelength, and the intervals of the resonance wavelengths of the first ring resonator and the second ring resonator are set so that a vernier mode interval that is an interval between the one wavelength and a wavelength that is closest to the one wavelength from among the plurality of wavelengths becomes wider than a reflection wavelength range of the reflector.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

The tunable laser and the tunable laser module according to the embodiments are described below with reference to FIGS. 1 to 14. The tunable laser according to the embodiments is a tunable laser in which a wavelength may be changed in a wide wavelength range, and that is obtained by combining an SOA and a vernier-type filter that has a combination of two filters each having a periodical wavelength selection characteristic and selects a wavelength.

Here, in the tunable laser having the vernier-type filter, the cycles of the selected wavelengths of the two filters are slightly different from each other, and laser oscillation may occur merely in a wavelength at which the selected wavelengths of the two filters are overlapped with each other. In addition, in the vernier-type filter, a filter characteristic is determined based on the cycle and the sharpness (finesse) of the resonance of each of the two filters, so that the wavelength tuning operation may be performed in the proper wavelength range by adjusting the parameters appropriately.

Specifically, the tunable laser according to the embodiment is a tunable laser using a wavelength filter including two ring resonators each of which is formed by a waveguide including a silicon waveguide core, from among tunable lasers each using the vernier-type filter. That is, the tunable laser according to the embodiment is a tunable laser using an SOA and the wavelength filter including the two ring resonators each of which is formed by the waveguide including the silicon waveguide core. Such a tunable laser is also referred to as a silicon waveguide ring resonator laser or a Si waveguide ring resonator laser.

In such a tunable laser, each of the ring resonators may be downsized so that the radius is reduced at minimum to a few μm. Therefore, the tunable laser is suited to a small-sized laser. In addition, it is desirable that such tunable laser is used, for example, as a tunable laser light source used for a wavelength multiple optical communication system. The waveguide including the silicon waveguide core is also referred to as a silicon waveguide or a Si waveguide. In addition, the wavelength filter is also referred to as a silicon waveguide filter, a Si waveguide filter, a silicon waveguide ring resonator filter, a Si waveguide ring resonator filter, or a ring resonator filter.

Figure 1:
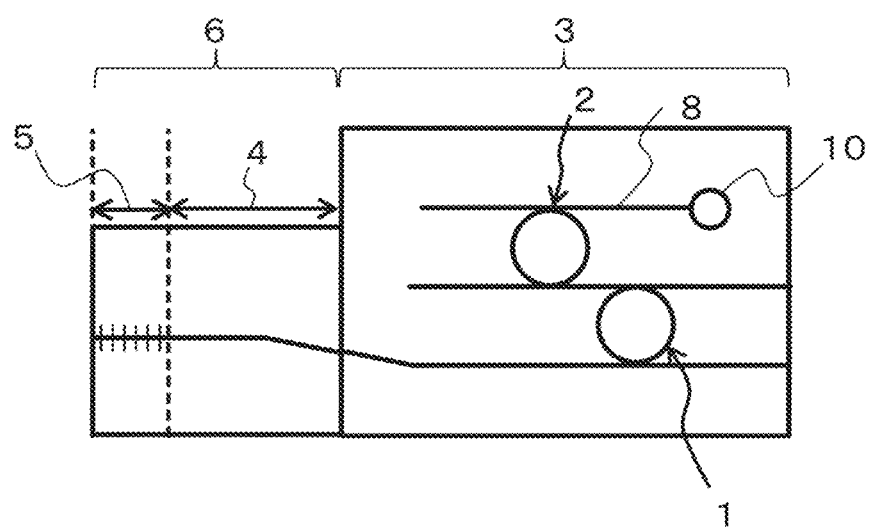
FIG. 1 is a schematic plan view illustrating a configuration of a tunable laser according to an embodiment.

In the embodiment, as illustrated in FIG. 1, a tunable laser includes a wavelength filter 3 including a first ring resonator 1 and a second ring resonator 2 each of which is formed by a waveguide including a silicon waveguide core, and an integrated device 6 in which an SOA (first semiconductor optical amplifier) 4 and a reflector 5 are integrated. Here, the first ring resonator 1 and the second ring resonator 2 included in the wavelength filter 3 have different intervals of the resonance wavelengths each of which periodically exists, and respectively shift the resonance wavelengths. That is, the wavelength filter 3 is a wavelength filter including the first ring resonator 1 and the second ring resonator 2 each of which is formed by the waveguide including the silicon waveguide core, and that have different intervals of the resonance wavelengths each of which periodically exists, and respectively shift the resonance wavelengths.

Here, the sizes of the ring waveguides that respectively form the first ring resonator 1 and the second ring resonator 2, that is, the sizes of the ring-shaped silicon waveguide (for example, curvature radius) are different, and thus, the intervals of the resonance wavelengths each of which periodically exists are different from each other. In addition, each of the first ring resonator 1 and the second ring resonator 2 includes a heater electrode 7 used to shift the resonance wavelength in the vicinity of the ring waveguide that forms the ring resonator, that is, in the vicinity of the ring-shaped silicon waveguide (see FIGS. 9A and 9B).

Here, as the configuration in which the resonance wavelength of each of the ring resonators 1 and 2 is shifted, the heater electrode 7 is provided in order to shift the resonance wavelength using the change in the refractive index due to heating, but the embodiment is not limited to such a heater electrode, and for example, an electrode (current injection electrode or voltage application electrode) may be provided in order to shift the resonance wavelength using current injection and voltage application. However, when the heater electrode 7 is provided in order to use utilize the change in the refractive index due to heating, loss caused by the shift of the resonance wavelength does not occur, so that there is an advantage that the resonance wavelength may be shifted without changing the loss, the finesse, and the like, of each of the ring resonators 1 and 2.

Figure 9A:
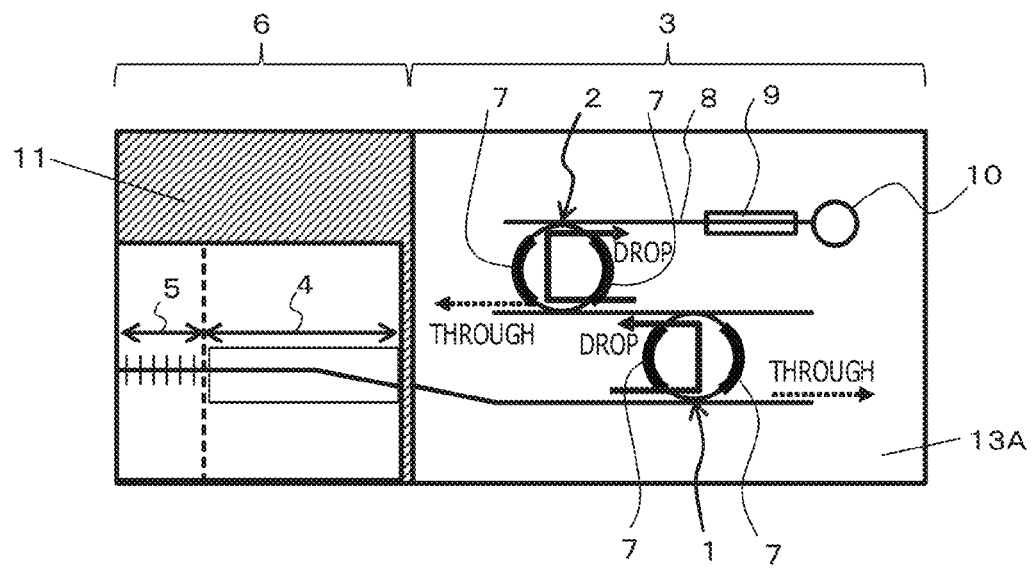
FIG. 9A is a plan view of specific configuration examples of the tunable laser.
Figure 9B:
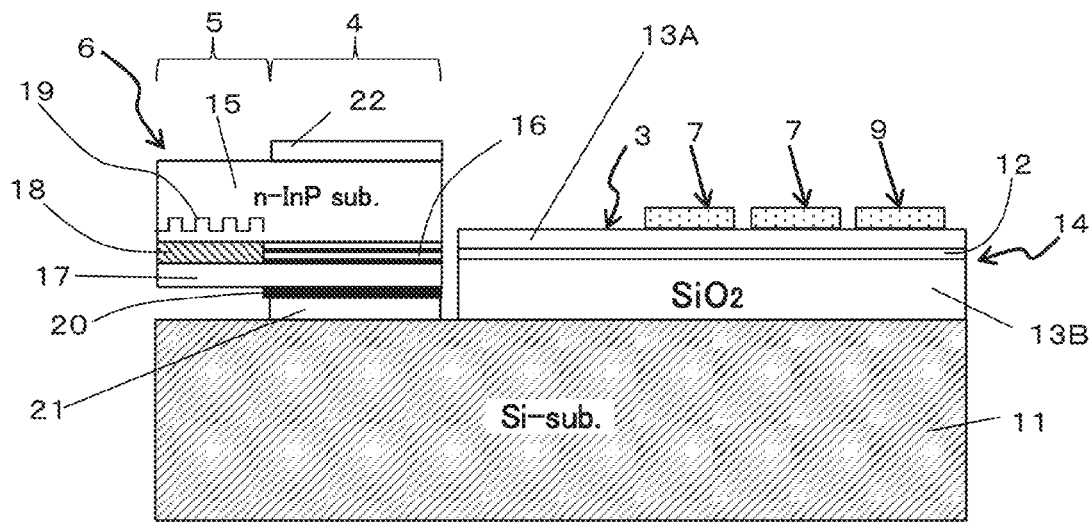
FIG. 9B is a cross-sectional view taken along a direction in which a waveguide extends.

In addition, the wavelength filter 3 includes a waveguide 8 (here, a waveguide including a silicon waveguide core) coupled to the first ring resonator 1 and the second ring resonator 2, and a phase control electrode 9 provided on the waveguide 8 and used to control a phase (see FIGS. 9A and 9B). Here, a heater electrode as the phase control electrode 9 is provided in the vicinity of the waveguide 8 coupled to the first ring resonator 1 and the second ring resonator 2. In addition, the wavelength filter 3 also includes a loop mirror 10 as a mirror used to constitute the laser resonator.

The integrated device 6 is an integrated device that is optically coupled to the wavelength filter 3 and in which the SOA 4 and the reflector 5 are provided in sequence from the side of the wavelength filter 3. Here, the integrated device 6 is an integrated device in which the SOA 4 and the reflector 5 are integrated monolithically. The integrated device 6 is also referred to as an SOA integrated device or an SOA integrated chip. In addition, the reflector 5 is, for example, a distribution Bragg reflector (DBR). Specifically, it is desirable that, as the reflector 5, a plurality of DBRs having different Bragg wavelengths are connected to each other in multiple-stages (see FIG. 10). As a result, the integration with the SOA 4 is achieved by a simple configuration, and the reflector 5 having a wide reflection wavelength range may be achieved.

Figure 2A:
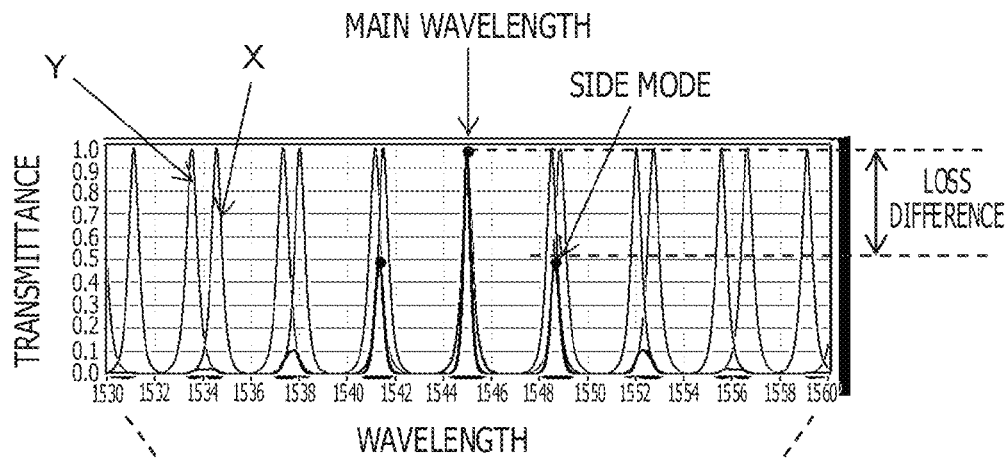
FIG. 2A is a diagram illustrating wavelength characteristics in the vicinity of main wavelengths of two ring resonators.
Figure 2B:
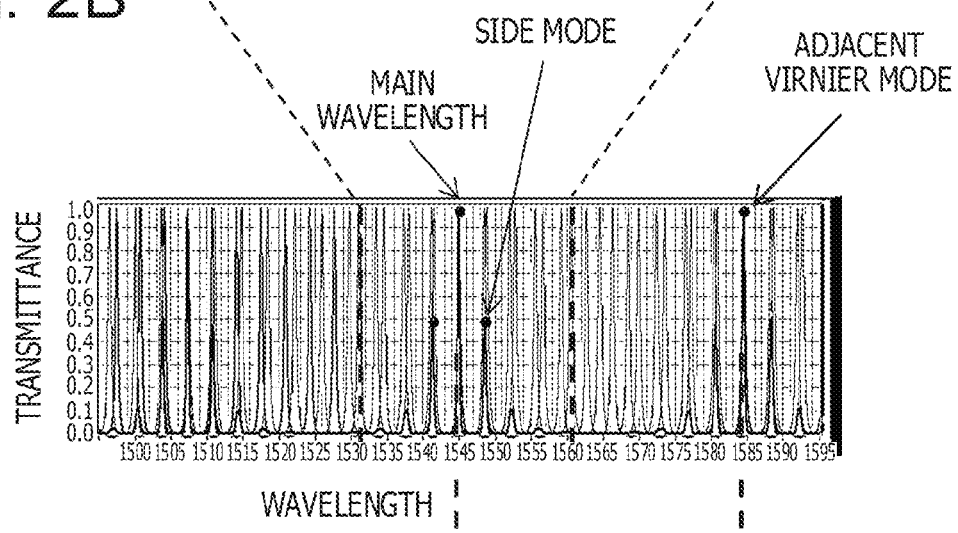
FIG. 2B is a diagram illustrating wavelength characteristics of wide wavelength ranges of the two ring resonators.
Figure 2C:
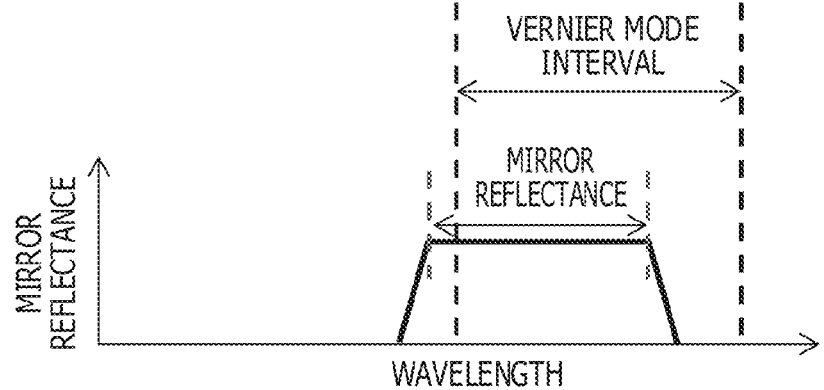
FIG. 2C is a diagram illustrating a relationship between reflection wavelength characteristics (reflection wavelength range) of a reflector and a vernier mode interval.

In addition, as illustrated in FIGS. 2A to 2C, and 3, the resonance wavelengths each of which periodically exists of the first ring resonator 1 and the second ring resonator 2 are overlapped with each other at one wavelength, and the resonance wavelengths are also overlapped with each other at a further plurality of wavelengths other than the one wavelength, and a vernier mode interval that is an interval between the one wavelength and a wavelength that is the closest to the one wavelength from among the further plurality of wavelengths is wider than the reflection wavelength range of the reflector 5. That is, the intervals of the resonance wavelengths of the first ring resonator 1 and the second ring resonator 2 are set so that the resonance wavelengths each of which periodically exists of the first ring resonator 1 and the second ring resonator 2 are overlapped with each other at the one wavelength, and the resonance wavelengths are also overlapped with each other at the further plurality of wavelengths other than the one wavelength, and the vernier mode interval that is the interval between the one wavelength and the wavelength that is the closest to the one wavelength from among the further plurality of wavelengths is wider than the reflection wavelength range of the reflector 5. In FIG. 2A, the resonance wavelength of the first ring resonator 1, which periodically exists, is indicated by the symbol X, and the resonance wavelength, which periodically exists, of the second ring resonator 2 is indicated by the symbol Y.

The one wavelength at which the resonance wavelengths of the first ring resonator 1 and the second ring resonator 2 are overlapped with each other is also referred to as a main wavelength. In addition, the further plurality of wavelengths, other than the one wavelength, at which the resonance wavelengths of the first ring resonator 1 and the second ring resonator 2 are overlapped with each other are also referred to as vernier mode wavelengths. That is, a wavelength different from the main wavelength from among the wavelengths at which the resonance wavelengths of the first ring resonator 1 and the second ring resonator 2 are overlapped with each other wavelength is referred to as the vernier mode wavelength.

In addition, a wavelength that is the closest to the one wavelength from among the further plurality of wavelengths, other than the one wavelength, at which the resonance wavelengths of the first ring resonator 1 and the second ring resonator 2 are overlapped with each other is referred to as an adjacent vernier mode wavelength or simply referred to as an adjacent vernier mode. That is, a wavelength that is different from the main wavelength and is the closest to the main wavelength from among the further plurality of wavelengths, other than the one wavelength, at which the resonance wavelengths of the first ring resonator 1 and the second ring resonator 2 are overlapped with each other is referred to as the adjacent vernier mode wavelength or simply referred to as the adjacent vernier mode.

In addition, the vernier mode interval is also referred to as an interval between the main wavelength and the adjacent vernier mode wavelength, an adjacent vernier mode interval, or an adjacent vernier mode wavelength interval. In addition, the reflector 5 is also referred to as a mirror. In addition, the reflection wavelength range of the reflector 5 is also referred to as a reflection bandwidth, a reflected wavelength band, a reflection range, or a DBR reflection bandwidth.

Figure 3:
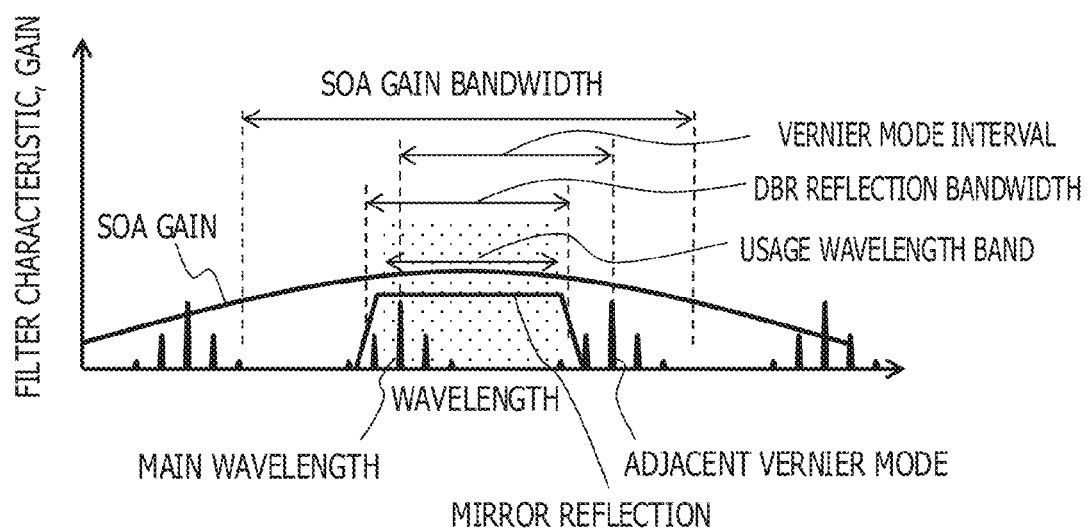
FIG. 3 is a diagram illustrating a vernier mode interval, reflection wavelength characteristics (reflection wavelength range) of a reflector, and an SOA gain characteristic (SOA gain bandwidth) in the tunable laser according to the embodiment.

Here, the vernier mode interval may be defined by $|FSR1 \times FSR2/(FSR1-FSR2)|$ by setting the resonance wavelength interval of the first ring resonator 1 as "FSR1", and setting the resonance wavelength interval of the second ring resonator 2 as "FSR2". In addition, as illustrated in FIG. 3, it is assumed that the reflection wavelength range of the reflector 5 is the laser operation wavelength range (usage wavelength band) or more of the tunable laser. For example, it is desirable that the reflection wavelength range of the reflector 5 is at least 10 nm or more and the laser operation wavelength range of the tunable laser or more. As a result, laser oscillation may be obtained in the desired wavelength variable range.

As a result, as illustrated in FIG. 3, when the resonance wavelengths of the first ring resonator 1 and the second ring resonator 2 are overlapped with each other at one wavelength (for example, a target wavelength that is an oscillation wavelength of the laser), it may be set that the resonance wavelengths that are overlapped with each other at the one wavelength become within the reflection wavelength range of the reflector 5, and the resonance wavelengths that are overlapped with each other at further wavelengths other than the one wavelength become outside of the reflection wavelength range of the reflector 5.

In this case, when the resonance wavelengths of the first ring resonator 1 and the second ring resonator 2 are caused to be overlapped with each other at the one wavelength, the intervals of the resonance wavelengths of the first ring resonator 1 and the second ring resonator 2 interval are set so that the resonance wavelengths that are overlapped with each other at the one wavelength become within the reflection wavelength range of the reflector 5, and the resonance wavelengths that are overlapped with each other at the further wavelengths other than the one wavelength do not become within the reflection wavelength range of the reflector 5. Thus, a single wavelength may be selected easily by the reflector 5 to cause the oscillation, and the oscillation does not occur in a plurality of wavelengths. Therefore, there is an advantage that it is avoided that laser light of an unnecessary wavelength is guided into the Si waveguide, and the light intensity is overly increased.

In addition, in the embodiment, as illustrated in FIG. 3, the vernier mode interval is narrower than the gain wavelength range of the SOA 4 (SOA gain bandwidth). That is, the intervals of the resonance wavelengths of the first ring resonator 1 and the second ring resonator 2 are set so that the vernier mode interval is narrower than the gain wavelength range of the SOA 4 (SOA gain bandwidth). As configured above, merely the resonance wavelengths that are overlapped with each other at the target wavelength that is the oscillation wavelength of the laser become within the reflection wavelength range of the reflector 5, and reflected onto the reflector 5, so that the laser oscillation selectively occurs in the target wavelength. In this case, as described above, it is only sufficient that the vernier mode interval becomes wider than the reflection wavelength range of the reflector 5, and it is unnecessary that the vernier mode interval becomes wider than the gain wavelength range of the SOA 4.

Figure 4:
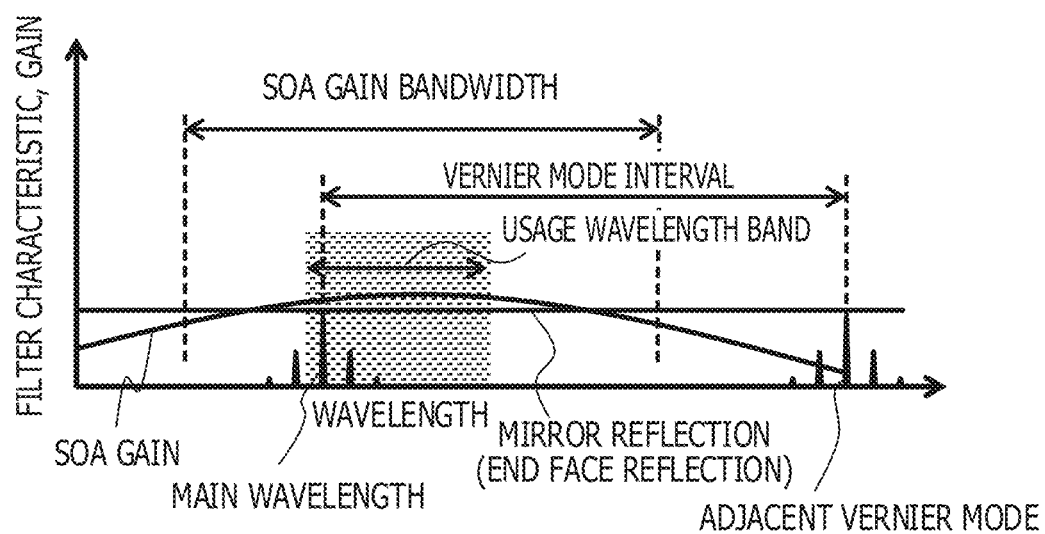
FIG. 4 is a diagram illustrating a vernier mode interval, reflection wavelength characteristics (reflection wavelength range) of a reflector, and an SOA gain characteristic (SOA gain bandwidth) in a tunable laser in which the reflector has a fixed reflectance for a wavelength using an Si waveguide filter.
Figure 5:
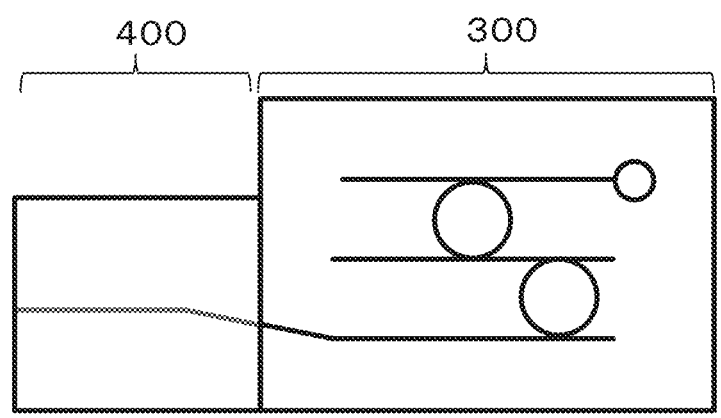
FIG. 5 is a schematic plan view illustrating a configuration of the tunable laser in which the reflector has the fixed reflectance for the wavelength using the Si waveguide filter.

On the contrary, as illustrated in FIG. 5, when a reflector having wavelength dependence such as the DBR reflector is not provided in a tunable laser constituted by an Si waveguide filter 300 and an SOA chip 400, the gain wavelength range of the SOA is utilized in order to cause the laser oscillation to selectively occur in the target wavelength. Therefore, as illustrated in FIG. 4, it is desirable that the vernier mode interval becomes wider than the gain wavelength range of the SOA (SOA gain bandwidth).

Due to such a configuration as illustrated in FIG. 3, the vernier mode interval may become narrow as compared with the case in which the reflector having wavelength dependence such as the DBR reflector is not provided in the tunable laser constituted by the Si waveguide filter 300 and the SOA chip 400 (see FIGS. 4 and 5). The detail is described later, but as a result, the finesse of the first ring resonator 1 and the second ring resonator 2 may be set low, so that the light intensity inside the waveguide including the silicon waveguide core is set low, and two-photon absorption is suppressed, and the change in the equivalent refractive index of the waveguide may be suppressed. As a result, when the laser output is increased (at the time of high output operation), the operation is less likely to become unstable. That is, in the tunable laser using the SOA 4 and the wavelength filter 3 including the two ring resonators 1 and 2 each of which is formed by the waveguide including the silicon waveguide core, the stable laser oscillation may be obtained even when the laser is operated with high output.

Figure 6:
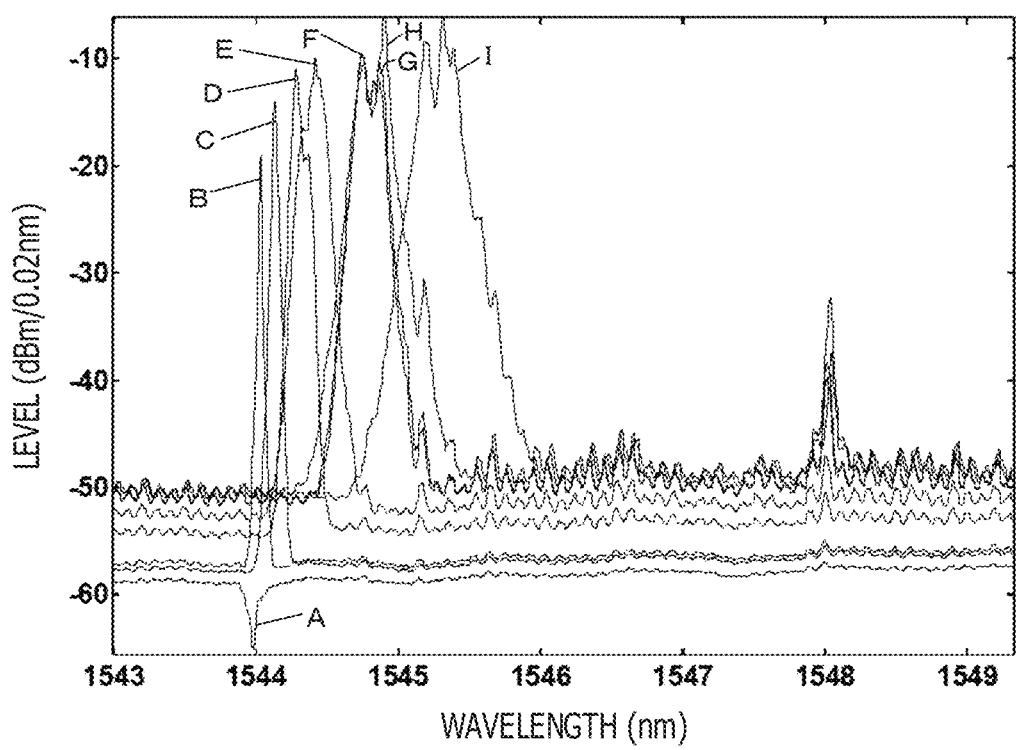
FIG. 6 is diagram illustrating a problem in the tunable laser using the Si waveguide filter.
Figure 7:
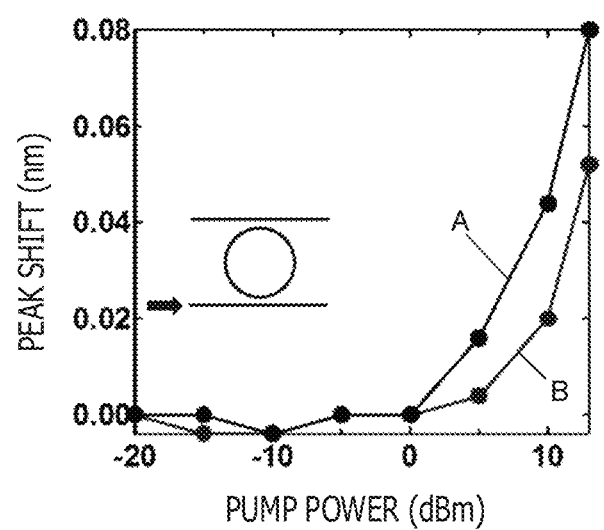
FIG. 7 is a diagram illustrating a problem in the tunable laser using the Si waveguide filter.

On the contrary, when the reflector having wavelength dependence such as the DBR reflector is not provided in the tunable laser constituted by the Si waveguide filter 300 and the SOA chip 400 (see FIG. 5), the finesse of the first ring resonator 1 and the second ring resonator 2 is not allowed to be set low, and when the laser output is increased, high intensity light is propagated to the silicon waveguide including the silicon waveguide core inside the laser resonator, and two-photon absorption occurs, and the equivalent refractive index of the silicon waveguide is changed. Therefore, for example, as illustrated in FIG. 6, when the laser output is increased, the oscillation spectrum is widened, so that multi-mode oscillation is caused. In addition, as illustrated in FIG. 7, a peak shift of the oscillation wavelength of the laser is increased. As a result, the operation becomes unstable. Therefore, it is difficult to achieve the high output.

FIG. 6 is a diagram illustrating SOA injection current dependence of the oscillation spectrum, and the solid lines A to I indicate the oscillation spectrum when the SOA injection current amount is increased gradually, and it is indicated that the oscillation spectrum is widened when the SOA injection current is increased gradually as indicated from the solid lines A to I in sequence. In addition, in FIG. 7, pump power dependence of the transmission spectrum peak wavelength is illustrated, and the solid lines A and B indicate peak shifts of the different ring waveguides, and it is indicated that the peak shift in the oscillation spectrum is increased when the SOA injection current amount (pump power) is increased.

In addition, in the design of the first and second ring resonators, it is desirable that occurrence of the oscillation in an adjacent vernier mode is avoided, and the side mode is suppressed, but as described above, the occurrence of the oscillation in the adjacent vernier mode may be avoided due to the provision of the reflector 5, so that the design of the first and second ring resonators 1 and 2 is performed easily. The detail is described below.

In the vernier-type filter according to the embodiment, in order to achieve the stable simple mode oscillation, it is desirable that one of the resonance wavelengths (ring resonance wavelengths) of the ring resonators is selected using the periodical filter characteristics of the two ring resonators. In order to select one of the resonance wavelengths, first, it is desirable that loss of an adjacent resonance wavelength (hereinafter, referred to as a side mode) that is away, by one cycle of the resonance wavelength of the ring resonator, from the main wavelength at which the resonance wavelengths of the two ring resonators are overlapped with each other is increased sufficiently. Second, in the vernier-type filter, when the peaks of the two ring resonators are overlapped with each other at a certain wavelength, a wavelength appears at which the wavelengths of the two ring resonators are overlapped with each other again, which is away from the peaks by a few cycles or more of the ring resonator. Such a wavelength is referred to as an adjacent vernier mode wavelength, for the main wavelength. In order to obtain the stable simple mode operation, it is desirable that the oscillation in the adjacent vernier mode wavelength is suppressed sufficiently for the main wavelength.

Here, when the reflector having wavelength dependence such as the DBR reflector is not provided in the tunable laser constituted by the Si waveguide filter 300 and the SOA chip 400 (see FIG. 5), the laser resonators are formed between the mirror inside the Si waveguide filter 300 and the end face of the SOA chip 400. The mirror inside the Si waveguide filter 300 and the end face of the SOA chip 400 function as mirrors each having a substantially fixed reflectance for the wavelength, so that the mirror and the end face reflect light of both wavelengths of the adjacent vernier mode wavelength and the main wavelength selected by the two ring resonators included in the Si waveguide filter 300. Thus, in order to cause laser oscillation to selectively occur in the main wavelength, it is desirable that the adjacent vernier mode wavelength is set so as to be away until a wavelength band in which gain of the SOA is sufficiently low, using the wavelength dependence of the gain of the SOA (see FIG. 4). That is, it is desirable that the vernier mode interval is set so as to be wider than the gain wavelength range of the SOA.

On the contrary, in the above-configured embodiment (see FIG. 1), the laser resonator is constituted by the mirror 10 inside the Si waveguide filter 3 and the reflector 5 on the SOA integrated chip 6, so that the laser oscillation does not occur in the wavelength outside the reflection wavelength range of the reflector 5. Thus, in order to suppress the laser oscillation in the adjacent vernier mode wavelength, it is only sufficient to cause the vernier mode interval to become wider than the reflection wavelength range of the reflector 5, and it is unnecessary to cause the vernier mode interval to become wider than the gain wavelength range of the SOA 4. As a result, as compared with the case in which the reflector having wavelength dependence such as the DBR reflector is not provided in the tunable laser constituted by the Si waveguide filter 300 and the SOA chip 400 (see FIGS. 4 and 5), the vernier mode interval may be narrowed (see FIG. 3).

In the vernier-type wavelength filter using the two ring resonators, the vernier mode interval is closely related to the design of the cycles and the finesse of the ring resonators, and the side mode may be suppressed sufficiently even when the finesse of the ring resonators is set low in a case in which the vernier mode interval is narrow, as described later. The finesse of the ring resonator is a parameter indicating the degree of the resonance, and as the finesse become larger, light confinement into the ring resonator become strong, and light intensity inside the waveguide becomes large. Thus, the reduction in the finesse of the ring resonator allows a reduction in the light intensity inside the silicon waveguide, and thus, two-photon absorption inside the silicon waveguide is suppressed, so that high laser output may be obtained while the stable operation is maintained.

Figure 8A:
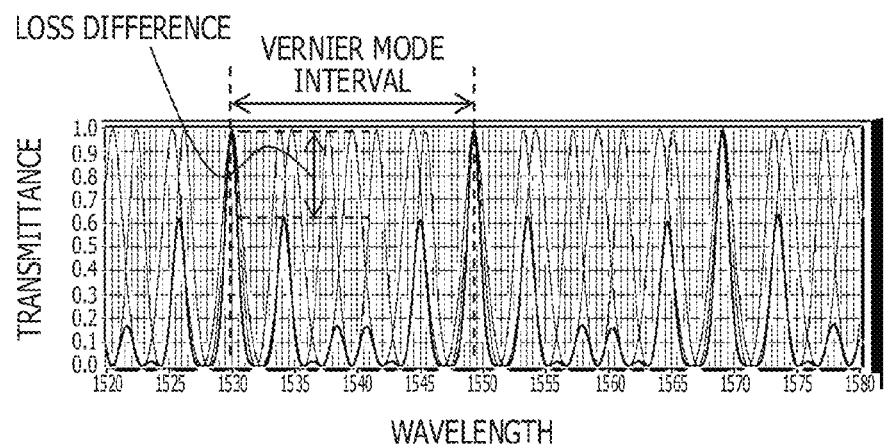
FIGS. 8A to 8C are diagrams illustrating a relationship between a spectrum, a finesse, and a vernier mode interval of the wavelength filter including the two ring resonators.
Figure 8B:
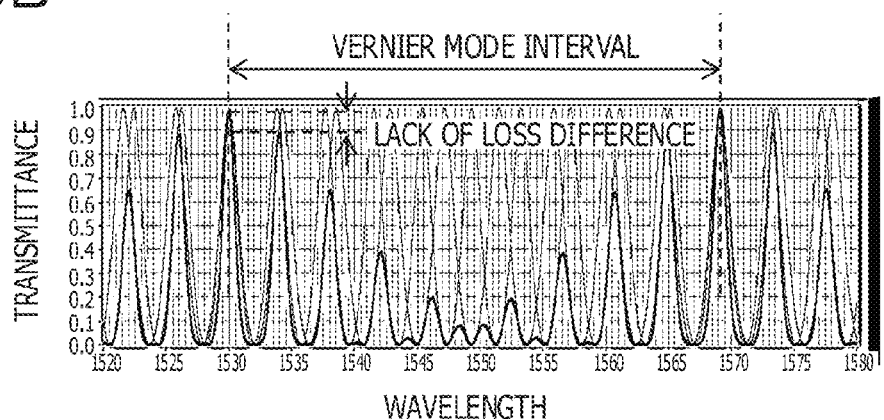
Figure 8C:
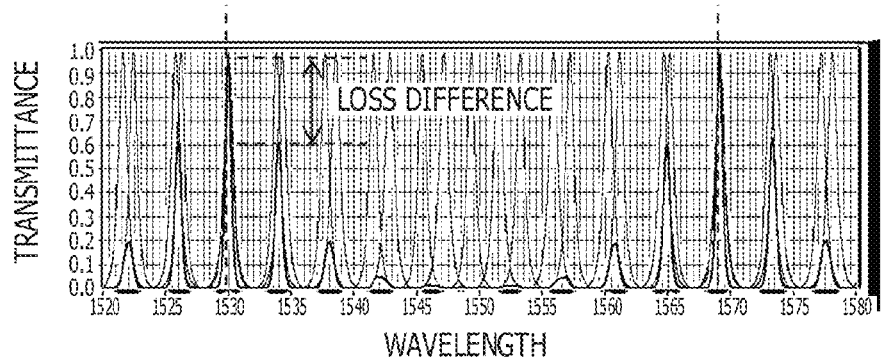

Here, FIG. 8A to FIG. 8C are diagrams illustrating light transmission characteristics (transmissivity) when the vernier mode interval and the finesse of the wavelength filter using the two ring resonators are changed. The vernier mode interval is obtained by |FSR1×FSR2/(FSR1−FSR2)| by respectively setting the intervals of the resonance wavelengths (resonance wavelength cycles) of the two ring resonators as FSR1 and FSR2. In addition, when the vernier mode interval is widened, it is necessary that a difference between the resonance wavelength cycles of the ring resonators, which is a denominator, is reduced.

When the difference between the resonance wavelength cycles of the ring resonators is reduced, the overlap of the peaks of two ring resonators in the side more becomes large, so that the side mode becomes likely to appear at the time of the laser oscillation. In order to avoid the problem, it is necessary that the finesse of the two ring resonators is increased, and each of the periodical resonance peak wavelengths is sharpened. For example, as illustrated in FIG. 8A, when the finesse is set at about 2.6, and the vernier mode interval is set at about 40 nm, the transmissivity of the side mode is reduced for the main wavelength (peak) by about 30% and become about 70% for the main wavelength (peak).

On the contrary, as illustrated in FIG. 8B, when the finesse is maintained at about 2.6, and the vernier mode interval is doubled at about 80 nm, that is, when the finesse is kept at same value, and the vernier mode interval is increased, the transmissivity of the side mode becomes about 90% for the main wavelength (peak), and the side mode is not sufficiently suppressed. In this case, as illustrated in FIG. 8C, when the vernier mode interval is set at about 80 nm, it is desirable that the finesse is doubled at about 5.2 in order to set the transmissivity of the side mode at about 70%. That is, when the vernier mode interval is increased, it is desirable that the finesse is also increased.

As described above, the desired finesse is increased in proportion to the vernier mode interval, but the desired finesse become smaller as the vernier mode interval is reduced. In such a principle, in the tunable laser using the Si waveguide ring resonator filter 3 according to the embodiment, the finesse of the ring resonators 1 and 2 may be set low, and thus, the light intensity inside the silicon waveguide is reduced, and the high output may be achieved while the stable laser oscillation operation is maintained. A specific configuration example of the tunable laser according to the embodiment is described below.

In the specific configuration example, as illustrated in FIGS. 9A and 9B, the tunable laser is obtained by combining the Si waveguide filter 3 including the first and second ring resonators 1 and 2 each of which is constituted by an Si waveguide 14 including an Si waveguide core 12 and $SiO_2$ clads 13A and 13B, which is formed on an Si substrate 11 (here, Silicon On Insulator (SOI) substrate), and the loop mirror 10, and the SOA integrated chip 6 in which the SOA 4 and the DBR 5 are integrated.

The SOA integrated chip 6 is formed, for example, on an n-InP substrate 15. In addition, in the area of the SOA 4 of the SOA integrated chip 6, a waveguide is formed that includes an InGaAsP based Multiple Quantum Well (MQW) active layer 16 as a core layer, in which the gain is obtained in a 1.55 μm band, and a p-InP clad layer 17. In addition, in the area of the DBR 5 of the SOA integrated chip 6, a DBR waveguide is formed that includes an InGaAsP layer 18 of about 1.3 μm composition as a core layer and the p-InP clad layer 17, and in which a diffraction grating 19 is formed in the vicinity of the core layer. In addition, the area of the SOA 4 and the area of the DBR 5 are bound to each other by butt joint. In addition, the p-InP clad layer 17 and a p-InGaAsP/InGaAs contact layer 20 are formed above the SOA active layer 16 and the DBR core layer 18. In addition, a p-side electrode 21 and an n-side electrode 22 used to cause current to flow are formed on the upper side and the lower side of the n-InP substrate 15 at least in the area of the SOA 4.

In FIGS. 9A and 9B, the SOA integrated chip 6 is installed in a terrace part formed to be adjacent to the Si waveguide 14 on the Si substrate 11 so as to be turned upside down so that the n-InP substrate 15 side face upward. Due to such installation, the heights of the waveguide core layers 16 and 18 of the SOA integrated chip 6 may be controlled precisely depending on the thickness of the p-InP clad layer 17, the p-InGaAsP/InGaAs contact layer 20, and the p-side electrode 21, thereby facilitating the height adjustment with the core layer 12 of the Si waveguide 14.

Figure 10:
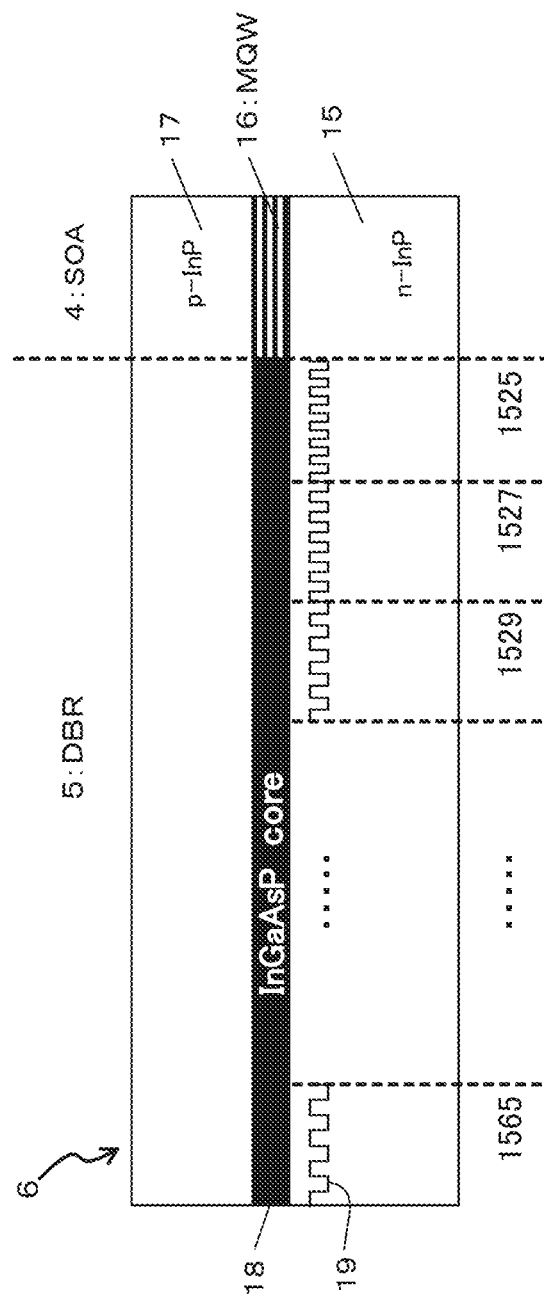
FIG. 10 is a schematic cross-sectional view illustrating a configuration of a DBR unit in the specific configuration example of the tunable laser according to the embodiment.

In addition, as illustrated in FIG. 10, the area of the DBR 5 is divided, for example, into 21 blocks, and the cycle of the diffraction grating 19 of each of the blocks is changed so that the Bragg wavelength of a diffraction grating 19 of each of the blocks is gradually changed from about 1525 nm to about 1565 nm by about 2 nm step, in sequence from the side close to the area of the SOA 4. As a result, the DBR 5 (DBR mirror) having a flat reflectance may be formed by a C-band (about 1525 to about 1565 nm) often used as an usage wavelength band in optical communication. Here, for example, the length of each of the blocks of the area of the DBR 5 is set at about 25 μm, and the entire length is set at about 525 μm. In addition, the reflectance of the area of the DBR 5 is set at a desired reflectance by adjusting a coupling coefficient of the diffraction grating 19 as appropriate.

Here, it is set that the Bragg wavelength of the diffraction grating 19 of the area of the DBR 5 becomes shorter as the area of the DBR 5 becomes closer to the side of the area of the SOA 4, but the embodiment is not limited to such an example, and for example, it may be set that the Bragg wavelength becomes longer as the area of the DBR 5 become closer to the side of the area of the SOA 4, and it is only sufficient to obtain a relatively-flat reflectance in a certain wavelength range as the entire area of the DBR 5. In addition, here, the area of the DBR 5 is divided into the blocks, and the Bragg wavelength is changed for each of the blocks, but the embodiment is not limited to such an example, and for example, the Bragg wavelength may be change continuously in a direction along the waveguide.

In addition, for example, it is preferable that the waveguide is tilted for the end face by about 7° in the vicinity of the end face by setting the length of the area of the SOA 4 at about 600 μm (see FIG. 9A). As a result, unnecessary reflection in the end face of the area of the SOA 4 may be suppressed, and the operation of the laser may be caused to become stable. In addition, in the active layer 16 formed by the MQW, the wavelength range in which gain occurs is relatively wide, and gain that is sufficient for laser oscillation even in about 100 nm range may be caused to occur depending on the current condition.

Figure 11A:
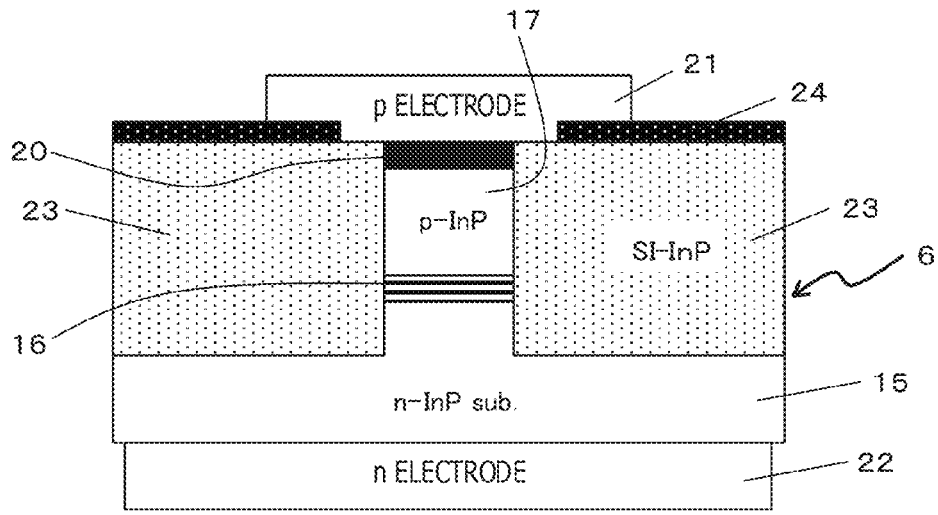
FIG. 11A is a schematic cross-sectional view illustrating a waveguide structure of the SOA unit in the specific configuration example of the tunable laser according to the embodiment.
Figure 11B:
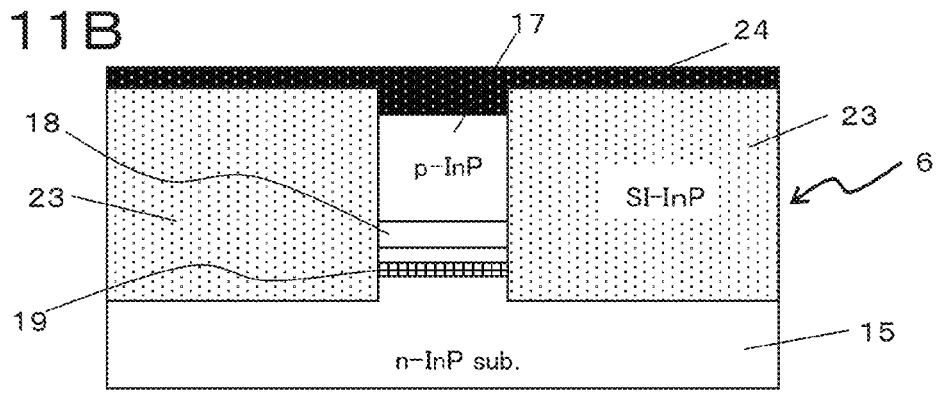
FIG. 11B is a schematic cross-sectional view illustrating a waveguide structure of the DBR unit.

As illustrated in FIGS. 11A and 11B, in the area of the SOA 4 and the area of the DBR 5 configured as described above, a part of the core layers 16 and 18, the clad layer 17, the substrate 15, and the like, is removed by etching other than a portion corresponding to the waveguide, and both sides of the part that has been subjected to the etching is embedded with semi-insulating (SI) InP layers 23. In addition, the p-side electrode 21 is provided merely above the core layer 16 of the area of the SOA 4 so as to be in contact with the contact layer 20, and the surface other than the surface with which the p-side electrode 21 is covered is covered with a $SiO_2$ passivation film 24.

Figure 11C:
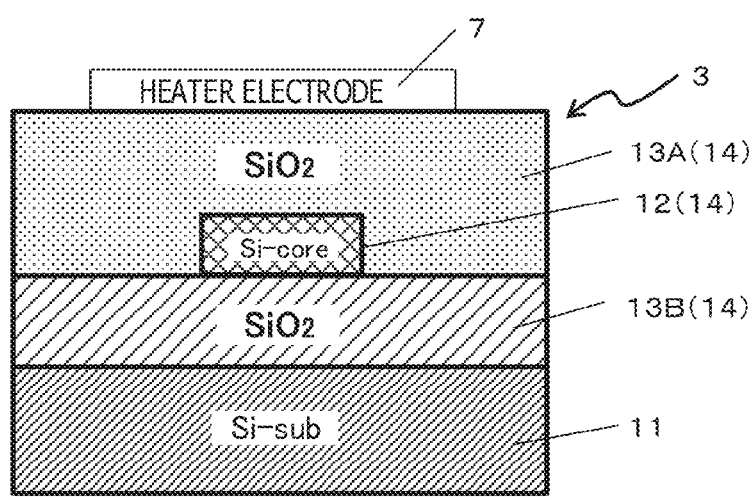
FIG. 11C is a schematic cross-sectional view illustrating a waveguide structure of the Si waveguide.

As illustrated in FIG. 11C, the Si waveguide filter 3 is formed using a SOI substrate, and has a waveguide structure in which the Si core layer 12 having the width of about 0.5 μm and the thickness of about 0.2 μm are covered by the $SiO_2$ clad layers 13A and 13B above the Si substrate 11. In such a Si waveguide filter 3, the first and second ring resonators 1 and 2 and the loop mirror 10 are formed (see FIG. 9A). In addition, in the first and second ring resonators 1 and 2, merely light of a wavelength at which the resonance wavelengths are overlapped with each other passes through the ring waveguide, and is propagated from the drop port to the straight waveguide, and light of a wavelength other than the wavelength is propagated from the through port to the straight waveguide without passing through the ring waveguide (see FIG. 9A).

In addition, the heater electrode 7 is provided in each of the first and second ring resonators 1 and 2, and may adjust the position of the resonance wavelength by adjusting the temperature of the waveguide of each of the ring resonators 1 and 2 and changing the refractive index. In addition, in a part of the Si waveguide, a phase control heater electrode 9 used to adjust a phase in the laser resonator is also provided (see FIGS. 9A and 9B).

In addition, the cycles of the resonance wavelengths of the first ring resonator 1 and the second ring resonator 2 are set to be different from each other slightly. For example, it is only sufficient to set the resonance wavelength interval of the first ring resonator 1 at about 6.00 nm, and set the resonance wavelength interval of the second ring resonator 2 at about 6.82 nm. Therefore, for example, it is only sufficient to set the equivalent refractive indexes of the waveguides of the first and second ring resonators 1 and 2 at about 2.00, and respectively set the curvature radiuses of the first and second ring resonators 1 and 2 at about 15.3 μm and about 13.4 μm. In this case, the vernier mode interval satisfies "|FSR1×FSR2/(FSR1−FSR2)|=|6.00×6.82/(6.82−6.00)|≈about 50 nm", and becomes wider than about 40 nm of the reflection wavelength range of the above-described DBR 5 (reflection wavelength bandwidth or DBR reflection bandwidth).

As illustrated in FIGS. 9A and 9B, such a Si waveguide filter 3 is optically connected (coupled) to the SOA 4 side of the above-described SOA integrated chip 6. In addition, pieces of light that are incident on the Si waveguide filter 3 from the SOA integrated chip 6 enter the first ring resonator 1 through the straight waveguide first. Pieces of light having wavelengths overlapped with the resonance wavelength of the first ring resonator 1, from among such pieces of light that are incident on the first ring resonator 1, are merely propagated to the second ring resonator 2 coupled to the drop port of the first ring resonator 1 through the straight waveguide.

Light having a wavelength overlapped with the resonance wavelength of the second ring resonator 2, from among such pieces of light of wavelengths overlapped with the resonance wavelength of the first ring resonator 1, is merely propagated to the straight waveguide coupled to the drop port of the second ring resonator 2. Such light that has been propagated from the drop port of the second ring resonator 2 to the straight waveguide is reflected (totally reflected) by the loop mirror 10 provided in the end portion opposite to such a straight waveguide.

In addition, the reflected light returns to the SOA integrated chip 6 through the same path, and is reflected by the DBR 5 of the SOA integrated chip 6. That is the way the laser resonator is formed between the DBR 5 of the SOA integrated chip 6 and the loop mirror 10 in the Si waveguide filter 3, and laser oscillation occurs at a wavelength at which the resonance wavelengths of the first and second ring resonators 1 and 2 have been overlapped with each other.

As described above, the vernier mode interval is wider than the DBR reflection bandwidth, so that the adjacent vernier mode wavelength is not within the wavelength range in which the laser oscillation may occur, which is limited by the DBR reflection bandwidth (see FIG. 3), and the laser oscillation in the vernier mode wavelength other than the main wavelength may be suppressed. Here, it is desirable that the finesse of the first and second ring resonators 1 and 2 is designed as described below, from the point of view of suppression of laser oscillation in the side mode, that is, obtaining a loss difference to some extent for the main wavelength.

Figure 12:
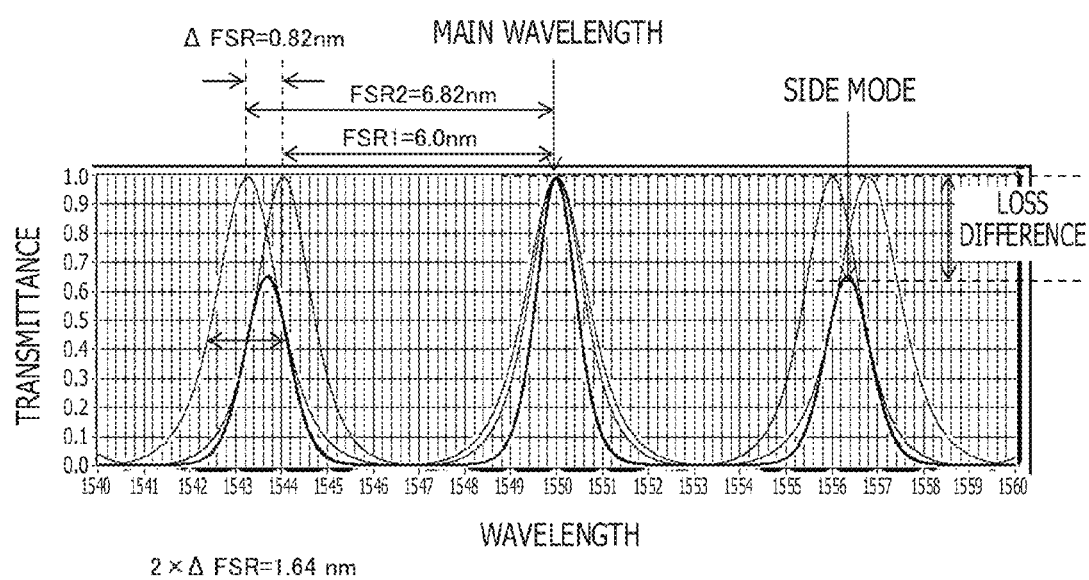
FIG. 12 is a diagram illustrating setting of the finesse of the ring resonator for side mode suppression in the specific configuration example of the tunable laser according to the embodiment.

For example, as described above, when the resonance wavelength interval of the first ring resonator 1 is set at about 6 nm, and the resonance wavelength interval of the second ring resonator 2 is set at about 6.82 nm, the vernier mode interval becomes about 50 nm. In this case, as illustrated in FIG. 12, the resonance wavelength interval of the first ring resonator 1 (FSR1) is shifted from the resonance wavelength interval of the second ring resonator 2 (FSR2) by about 0.82 nm, so that the peaks of the resonance wavelengths of the first ring resonator 1 and the second ring resonator 2 in the side mode are shifted from each other by about 0.82 nm (ΔFSR=0.82 nm).

When the full width at half maximum (FWHM) of one of the peaks of the resonance wavelengths of the first and second ring resonators 1 and 2 is set at about 1.64 nm corresponding to the doubled resonance wavelength interval difference, the transmission intensity (transmissivity) of the overlapped resonance wavelengths of the first and second ring resonators 1 and 2 in the side mode becomes less than about 70%. In such a condition, about 2 dB of loss of the wavelength in the side mode is obtained, for the main wavelength, so that the oscillation in the side mode is sufficiently suppressed, and laser oscillation may occur merely at the main wavelength (main mode). In this case, the FWHM becomes about "0.82×2=about 1.64 nm" for the resonance wavelength interval of about 6.82 nm of the second ring resonator 2, so that the finesse becomes about 4.2. Thus, as long as the ring resonator has the finesse of about 4.2 or more, the oscillation in the side mode may be suppressed sufficiently.

In addition, when a reflector having wavelength dependence such as the DBR reflector is not provided in the tunable laser constituted by the Si waveguide filter 300 and the SOA chip 400 (see FIG. 5), it is desirable that the vernier mode interval is set at about 100 nm or more, which corresponds to a gain bandwidth of the SOA (see FIG. 4). To that end, when the resonance wavelength interval of the first ring resonator is set at about 6 nm similar to the above-described embodiment, it is desirable that the resonance wavelength interval of the second ring resonator is set at about 6.38 nm, and the difference between the intervals of the resonance wavelengths is about halved as compared with the above-described embodiment. In this case, the resonance wavelength interval of the first ring resonator is shifted from the resonance wavelength interval of second ring resonator by about 0.38 nm, so that the peaks of the resonance wavelengths of the first ring resonator and the second ring resonator in the side mode are shifted from each other by about 0.38 nm (peak wavelength difference of about 0.38 nm).

In addition, when the transmissivity of the side mode is set at about 70% similar to the above-described embodiment, the peak wavelength difference in the side mode is about 0.38 nm that is about half of the transmissivity of the side mode, so that it is desirable that the FWHM of one of the peaks of the resonance wavelengths of the first and second ring resonators is set at "about 0.38×2=about 0.76" nm. As described above, it is desirable that the FWHM is set at "about 0.38×2=about 0.76" nm for the resonance wavelength interval of about 6.38 nm of the second ring resonator, so that about 8.3 of the finesse, which is about doubled as compared with the above-described embodiment, is desired. In other words, in the structure of the above-described embodiment, about half the finesse of the ring resonator finesse is sufficient in order to achieve similar side mode suppression.

When this is generalized, it is only sufficient that the FWHM of each of the peaks of the ring resonators is twice the difference between the intervals of the resonance wavelengths of the first and second ring resonators, that is, is smaller than "(FSR2−FSR1)×2" in order to obtain the desired finesse. When the finesse "f" is defined using the second ring resonator, the finesse is "FSR2/FWHM", so that it is only sufficient to satisfy "f≥FSR2/{2×(FSR2−FSR1)}". As described above, when the intervals of the resonance wavelengths of the first and second ring resonators 1 and 2 are respectively set as "FSR1" and "FSR2", and the vernier mode interval is set as "$\Delta\lambda_R$", the vernier mode interval is represented by "$\Delta\lambda_R$=|FSR1×FSR2/(FSR1−FSR2)|", and when the formula of the finesse f is modified based on such a relationship, it is only sufficient to set the finesse f at "$\Delta\lambda_R$/(2×FSR1)" or more (f≥$\Delta\lambda_R$/(2×FSR1)).

As understood from the above-described formula, as the vernier mode interval $\Delta\lambda_R$ becomes smaller, the desired finesse becomes smaller proportionately. In addition, the light intensity inside the ring resonator is substantially proportional to the finesse of the ring resonator. Therefore, in the above-described structure according to the embodiment in which the finesse may be reduced by half, the light intensity inside the ring resonator may be reduced in half. This means that the upper limit of the light intensity inside the laser resonator in which the unstable operation of the laser occurs may be doubled, and that the unstable operation does not occur even when the light output of the laser, which is proportional to the light intensity inside the laser resonator, is about doubled. As a result, the output of the laser may be increased while the stable operation is maintained.

Here, the lower limit of the finesse is set at "$\Delta\lambda_R$/(2×FSR1)", but it is desirable that the upper limit is set at about 1.5 times the lower limit, that is, set at "1.5×$\Delta\lambda_R$/(2×FSR1)" or less (f≤1.5×$\Delta\lambda_R$/(2×FSR1)), from the point of view of an advantage for a reduction in the light intensity inside the ring resonator when the finesse is low. Thus, in the tunable laser according to the embodiment, there is an advantage that the high output is achieved while the operation does not become unstable even when the SOA 4 and the wavelength filter 3 including the two ring resonators 1 and 2 each of which is formed by the waveguide including the silicon waveguide core are used.

In the above-described embodiment, the wavelength filter 3 including the two ring resonators 1 and 2 is used as an example, but the embodiment is not limited to such an example, and a wavelength filter including three or more ring resonators may be used. Here, when the wavelength filter including the three or more ring resonators is used, the influence of the vernier mode between first and second ring resonators is suppressed by an effect of a third ring resonator to some extent, but the vernier mode may be much further suppressed by the reflector according to the above-described embodiment (reflection bandwidth of the DBR). Therefore, even when the three or more ring resonators are used, the configuration of the above-described embodiment has a structure that is suited to narrow the vernier mode intervals, and an effect in which the finesse is reduced, and the light output of the laser is increased eventually may be obtained similar to the case in which the two ring resonators are used.

Figure 13A:
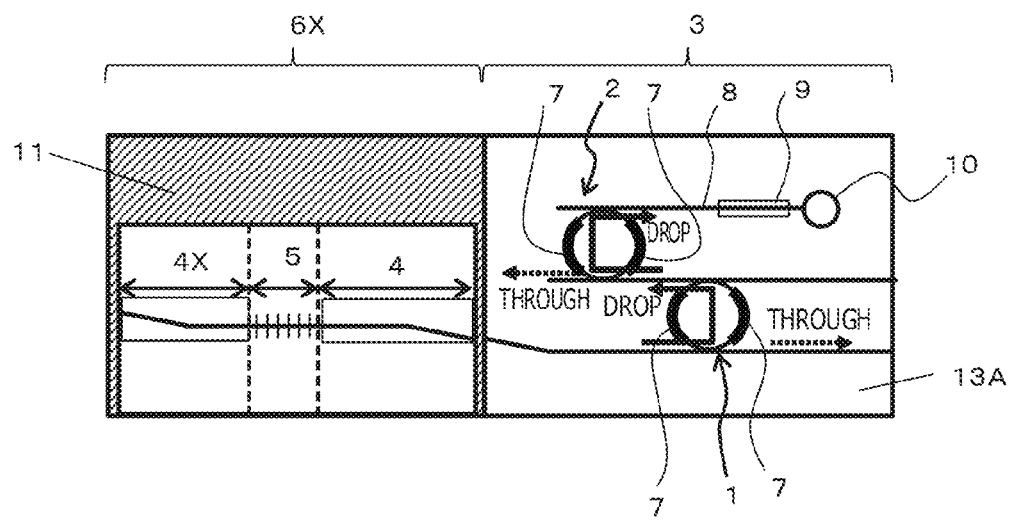
FIG. 13A is a plan view of specific configuration examples of the tunable laser.
Figure 13B:
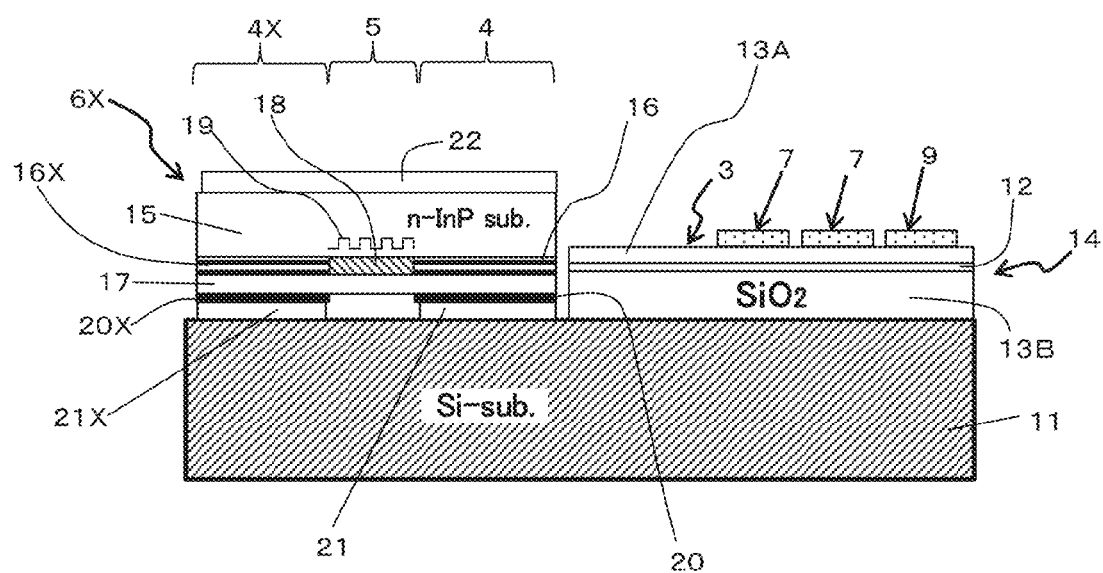
FIG. 13B is a cross-sectional view taken along a direction in which a waveguide extends.

In addition, in the above-described embodiment, the integrated device 6 is the integrated device in which the SOA 4 and the reflector 5 are provided in sequence from the side of the wavelength filter 3, but the embodiment is not limited to such an example. For example, as illustrated in FIGS. 13A and 13B, in an integrated device 6X, a first SOA (first semiconductor optical amplifier) 4, a reflector 5, and a second SOA (second semiconductor optical amplifier) 4X may be provided in sequence from the side of the wavelength filter 3. That is, the integrated device 6X may be an SOA integrated chip in which a DBR as the reflector 5 is provided between the first SOA 4 and the second SOA 4X.

It is only sufficient that the configuration of the integrated device 6X, that is, the waveguide structures of the SOA 4, the SOA 4X, and the DBR 5, the configuration of the wavelength filter 3, that is, the structure of the Si waveguide filter 3, and the like, are similar to the case of the above-described embodiment. This is a first modification of the embodiment.

In this case, it is only sufficient that the second SOA 4X is configured similar to the first SOA 4. That is, it is only sufficient that a waveguide in which an InGaAsP system MQW active layer 16X having gain in a 1.55 µm band is used as a core layer, and that includes the p-InP clad layer 17, is formed in the area of the second SOA 4X of the SOA integrated chip 6X. In addition, it is only sufficient that such an area of the second SOA 4X and the area of the DBR 5 are bound to each other by butt joint. In addition, it is only sufficient that, above the active layer 16X of the second SOA 4X, the p-InP clad layer 17 and the p-InGaAsP/InGaAs contact layer 20X are formed, and the p-side electrode 21X is provided.

In addition, the side of the first SOA 4 of the SOA integrated chip 6X is optically coupled to the Si waveguide filter as the wavelength filter 3. In this case, the laser resonator is constituted by the DBR 5 of the SOA integrated chip 6X and the loop mirror 10 in the Si waveguide filter 3, and the first SOA 4 functions as a gain medium of the laser. In addition, the second SOA 4X functions as an optical amplifier that amplifies the laser output from the DBR 5.

For example, as long as gain of 3 dB is obtained in the second SOA 4X, the laser output from the DBR 5 used to obtain an output equivalent to that of the above-described embodiment may be reduced by a gain portion of the second SOA 4X, that is, halved. Therefore, the light intensity of the Si waveguide inside the laser resonator is further suppressed, and stable laser oscillation may be obtained even in the operation by high output, with the effect of the reduction in the finesse of the ring resonators 1 and 2.

In addition, in the above embodiment and first modification, the tunable laser is described, but a tunable laser module may be configured by coupling a power source, a monitor unit, and the like, to the tunable laser. In this case, it is only sufficient that the tunable laser module includes the tunable laser according to the above-described embodiment and first modification, an SOA power source (first SOA power source, that is, first semiconductor optical amplifier power source) 30, a first ring resonator power source 31, a second ring resonator power source 32, a first monitor unit 33, and a controller 34 (see FIG. 14). Here, the SOA power source 30 is electrically coupled to the SOA 4 (first semiconductor optical amplifier).

In addition, the first ring resonator power source 31 is electrically coupled to the first ring resonator 1. In addition, the second ring resonator power source 32 is electrically coupled to the second ring resonator 2. In addition, the first monitor unit 33 monitors output light from the tunable laser. In addition, the controller 34 controls the SOA power source 30, the first ring resonator power source 31, and the second ring resonator power source 32, based on the monitor information from the first monitor unit 33.

Figure 14:
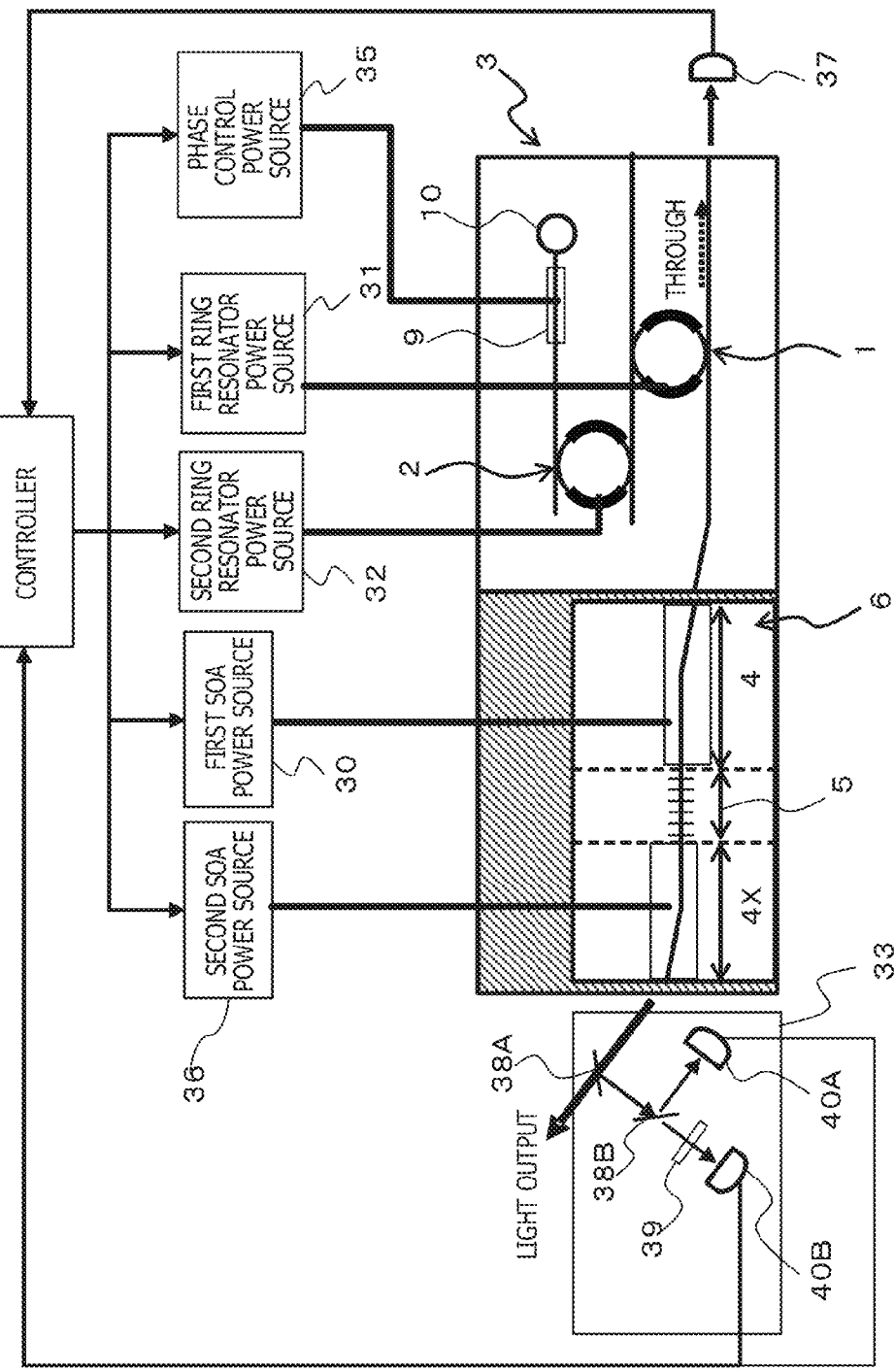
FIG. 14 is a schematic diagram illustrating a configuration of a tunable laser module according to the embodiment.

In addition, as described in the tunable laser according to the above-described embodiment and first modification, when the phase control electrode 9 used to control the phase is included in the waveguide of the wavelength filter 3, the waveguide of the wavelength filter 3 may further include a phase control power source 35 electrically coupled to the phase control electrode 9 (see FIG. 14). In addition, the controller 34 may control the phase control power source 35 based on the monitor information from the first monitor unit 33.

In addition, as described in the tunable laser according to the above-described first modification, when it is assumed that the integrated device 6X includes the first SOA (first semiconductor optical amplifier) 4, the reflector (DBR) 5, and the second SOA (second semiconductor optical amplifier) 4X in sequence from the side of the wavelength filter 3, as illustrated in FIG. 14, a second SOA power source (second semiconductor optical amplifier power source) 36 electrically coupled to the second SOA 4X, and a second monitor unit 37 that monitors light inside the wavelength filter 3 may be further included in the integrated device 6X. In addition, the controller 34 may control the first SOA power source 30, the second SOA power source 36, the first ring resonator power source 31, and the second ring resonator power source 32, based on the monitor information from the first monitor unit 33 and the second monitor unit 37.

In this case, it is desirable that the controller 34 controls the first SOA power source 30, based on the monitor information from the second monitor unit 37 while controlling the second SOA power source 36, the first ring resonator power source 31, and the second ring resonator power source 32, based on the monitor information of the first monitor unit 33. A tunable laser module obtained by adding a control system including power sources used to drive the SOA 4, the SOA 4X, the ring resonators 1 and 2, and the like, which are included in the tunable laser, the monitor unit, and the like, to the tunable laser according to the above-described first modification is described as an example in detail below with reference to FIG. 14.

Here, as illustrated in FIG. 14, the tunable laser module includes the first SOA power source 30, the second SOA power source 36, the first ring resonator power source 31 (here, heater power source), the second ring resonator power source 32 (here, heater power source), and the phase control power source 35 (here, heater power source), as power sources. In addition, the tunable laser further includes a photodiode (PD) that detects the intensity of light that has been output externally from the through port of the first ring resonator 1 included in the Si waveguide filter as the wavelength filter 3, as the second monitor unit 37 that monitors light in the wavelength filter 3.

In addition, such a photodiode 37 is coupled to the controller 34, and the controller 34 controls an output current value of the first SOA power source 30, that is, a current amount supplied from the first SOA power source 30 to the first SOA 4, based on the output (output value) from the photodiode 37 so that the intensity of laser light output from the DBR 5 to the side of the second SOA 4X becomes a certain value or less. As a result, it may be suppressed that oscillation of the laser becomes unstable due to a too high light intensity in the Si waveguide inside the laser resonator.

In addition, the tunable laser further includes two beam splitters 38A and 38B, an etalon filter 39, two photodiodes 40A and 40B, in the first monitor unit 33 that monitors output light from the tunable laser. Here, the output light from the tunable laser, that is, a part of light output from the side of the second SOA 4X is branched, for example, into "10:1" by the beam splitter 38A, and the branched part of the light is further branched by the beam splitter 38B. In addition, one of the pieces of light, which has been branched by the beam splitter 38B is incident on the photodiode 40A as is, and the other piece of light is incident on the photodiode 40B through the etalon filter 39 (here, wavelength locker Fabry-Perot etalon filter).

In addition, the controller 34 controls an output current value of the second SOA power source 36, that is, a current amount supplied from the second SOA power source 36 to the second SOA 4X, based on the output (output value) from the photodiode 40A so that a desired light output is obtained. In addition, the controller 34 controls an output current value of the first ring resonator power source 31, an output current value of the second ring resonator power source 32, and an output current value of the phase control power source 35, based on the ratio of the output (output value) from the photodiode 40A and the output (output value) from photodiode 40B.

That is, based on the ratio of the outputs from the two photodiodes 40A and 40B, the controller 34 controls the current amount supplied from the first ring resonator power source 31 to the first ring resonator 1 (here, the heater electrode 7), the current amount supplied from the second ring resonator power source 32 to the second ring resonator 2 (here, the heater electrode 7), and the current amount supplied from the phase control power source 35 to the phase control electrode 9 (here, heater electrode). As a result, the resonance wavelengths of the first and second ring resonators 1 and 2 are overlapped with each other at a desired wavelength, and laser oscillation is caused to occur in the wavelength.

It is desirable that a table of a condition in which the resonance wavelengths of the first and second ring resonators 1 and 2 are overlapped with each other at the desired wavelength, that is, a condition table in which a relationship between the oscillation wavelength and the heater current amount is defined is created in advance, for the current amounts (heater current amounts) supplied to the first and second ring resonators 1 and 2. In addition, it is desirable that the controller 34 sets the heater current amounts supplied to the first and second ring resonators 1 and 2, based on such a condition table.

As configured above, the laser output from the side on the second SOA 4X may be set randomly while the light intensity inside the laser resonator constituted by the DBR 5 of the SOA integrated chip 6 and the loop mirror 10 inside the Si waveguide filter 3 is maintained at a certain value or less. Therefore, the high output may be achieved while the unstable operation of the laser is suppressed. Here, the case is described above in which the light that has been output from the through port of the first ring resonator 1 is monitored by the photodiode as the second monitor unit 37 that monitors light in the wavelength filter 3, that is, light inside the laser, but the embodiment is not limited to such an example.

For example, a light splitter used to separate a part of laser light is provided in the Si waveguide on the side of the SOA integrated chip 6 for the first ring resonator 1, and the light that have been separated by the light splitter may be monitored by the photodiode. In this case, the part of the laser light is separated, so that the intensity of output light from the tunable laser, that is, the intensity of light output from the side of the second SOA 4X is slightly reduced, but the light intensity inside the laser resonator may be monitored without the influence of wavelength dependence of the ring resonator. Therefore, the state of the light intensity inside the laser resonator is monitored further precisely, and the laser oscillation may be controlled so as not to become unstable. In addition, on the left side of FIG. 14, a configuration is illustrated in which a monitor used to perform wavelength control using the two PDs and the etalon is provided, but a similar configuration in which the monitor used to perform wavelength control is provided may be illustrated on the right side of FIG. 14. In this case, there is an advantage that the wavelength control may be performed even when light is not output on the left side.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A tunable laser module comprising:
   a tunable laser that includes
      a wavelength filter that includes a first ring resonator and a second ring resonator each of which is formed by a waveguide including a silicon waveguide core, and each of which is capable of shifting each of resonance wavelengths that exit periodically and whose intervals are different from each other, and
      an integrated device that is optically coupled to the wavelength filter, and in which a first semiconductor optical amplifier and a reflector are provided in sequence from a side of the wavelength filter;
   a first semiconductor optical amplifier power source electrically coupled to the first semiconductor optical amplifier;
   a first ring resonator power source electrically coupled to the first ring resonator;
   a second ring resonator power source electrically coupled to the second ring resonator;
   a first monitor unit that monitors light from the tunable laser; and
   a controller that controls the first semiconductor optical amplifier power source, the first ring resonator power source, and the second ring resonator power source, based on monitor information from the first monitor unit,
   wherein the first semiconductor optical amplifier, the reflector, and a second semiconductor optical amplifier are provided in the integrated device, in sequence, from the side of the wavelength filter,
   wherein the tunable laser module further includes a second semiconductor optical amplifier power source electrically coupled to the second semiconductor optical amplifier, and a second monitor unit that monitors light in the wavelength filter,
   wherein the controller controls the first semiconductor optical amplifier power source, the second semiconductor optical amplifier power source, the first ring resonator power source, and the second ring resonator power source, based on pieces of monitor information from the first monitor unit and the second monitor unit, and
   wherein the controller controls the second semiconductor optical amplifier power source based on the monitor information from the first monitor unit, and controls the first semiconductor optical amplifier power source based on the monitor information from the second monitor unit.

2. The tunable laser module according to claim 1, wherein the resonance wavelengths of the first ring resonator and the second ring resonator, each of which exists periodically, are overlapped with each other at one wavelength, and the resonance wavelengths are overlapped with each other also at a plurality of wavelengths other than the one wavelength, and
   the intervals of the resonance wavelengths of the first ring resonator and the second ring resonator are set so that a vernier mode interval that is an interval between the one wavelength and a wavelength that is closest to the one wavelength from among the plurality of wavelengths becomes wider than a reflection wavelength range of the reflector.

3. The tunable laser module according to claim 1, wherein the wavelength filter includes a waveguide coupled to the first ring resonator and the second ring resonator, and a phase control electrode provided in the waveguide and used to control a phase, and wherein
   the tunable laser module includes a phase control power source electrically coupled to the phase control electrode, and
   the controller controls the phase control power source based on monitor information from the first monitor unit.

* * * * *